(12) United States Patent
Hartanto (10) Patent No.: US 8,890,562 B1
(45) Date of Patent: Nov. 18, 2014

(54) AT-SPEED TESTING OF MULTI-DIE INTEGRATED CIRCUITS

(75) Inventor: Ismed D. Hartanto, Castro Valley, CA (US)

(73) Assignee: Xilinx, Inc., San Jose, CA (US)

( * ) Notice: Subject to any disclaimer, the term of this patent is extended or adjusted under 35 U.S.C. 154(b) by 397 days.

(21) Appl. No.: 13/231,101

(22) Filed: Sep. 13, 2011

(51) Int. Cl.
*G01R 31/02* (2006.01)

(52) U.S. Cl.
USPC ..................................... 324/762.06

(58) Field of Classification Search
USPC ................ 324/762.01–763.01, 500
See application file for complete search history.

(56) References Cited

U.S. PATENT DOCUMENTS

| 7,724,016 | B2 * | 5/2010 | Yuan et al. | 324/754.23 |
| 8,327,201 | B1 * | 12/2012 | Lai | 714/725 |
| 2012/0126846 | A1 * | 5/2012 | Jong et al. | 324/762.03 |

\* cited by examiner

*Primary Examiner* — Melissa Koval
*Assistant Examiner* — Trung Nguyen
(74) *Attorney, Agent, or Firm* — Kevin T. Cuenot; Lois D. Cartier (57) ABSTRACT

An integrated circuit (IC) structure can include an interposer including a plurality of inter-die wires and a first die coupled to the interposer. The first die can include a first output including a first flip-flop coupled to a first inter-die wire of the plurality of inter-die wires and a first input including a second flip-flop coupled to a second inter-die wire of the plurality of inter-die wires. The IC structure can include a second die coupled to the interposer. The second die can be configured with a first circuit design forming circuitry that couples the first inter-die wire to the second inter-die wire.

14 Claims, 4 Drawing Sheets

AT-SPEED TESTING OF MULTI-DIE INTEGRATED CIRCUITS

FIELD OF THE INVENTION

One or more embodiments disclosed within this specification relate to integrated circuits (ICs). More particularly, one or more embodiments relate to testing ICs.

BACKGROUND

A semiconductor integrated circuit (IC) is manufactured using a multi-phase process involving photographic and chemical process steps. In general, common phases in fabricating an IC can include, but are not limited to, front-end-of-line (FEOL) processing, back-end-of-line (BEOL) processing, wafer testing, die preparation, and packaging. FEOL processing generally refers to the formation of circuit elements such as transistors. BEOL processing generally refers to the formation of metal layers and interconnects. Wafer testing or wafer sort generally refers to functional testing that can be performed on dies while still in wafer form. Die preparation generally refers to preparatory steps applied to dies for packaging. Finally, packaging generally refers to the process of mounting or placing dies within plastic, ceramic, or other packages that facilitates use of the IC within another system, e.g., upon a circuit board.

Typically, ICs are characterized in terms of performance. Performance can be measured in terms of whether the IC is able to perform within established design requirements relating, for example, to operating frequency, signal fidelity, signal response, or the like. Each IC can be classified into one of a plurality of different "bins," where each bin refers to a particular range of performance typically within the design requirements. Each IC can be priced and sold according to the particular bin to which the IC is classified. Performance analysis also facilitates the identification of ICs that do not meet minimum design requirements.

In some cases, a wire formed within an IC can be viewed as functional in that the wire passes a signal, but exhibits other types of defects. The wire, for example, may not appear as an open circuit when tested. Despite the passage of signal, the defects present in the wire may cause the wire to fail to meet design requirements. For example, when tested the wire may have a resistance that is too high or out of tolerance when compared with established design requirements for the IC. In another example, the wire may exhibit delay characteristics that are too large or out of tolerance when compared with established design requirements for the IC.

SUMMARY

One or more embodiments disclosed within this specification relate to integrated circuits (ICs) and, more particularly, to testing ICs.

An embodiment can include an IC structure. The IC structure can include an interposer including a plurality of inter-die wires and a first die coupled to the interposer. The first die can include a first output having a first flip-flop coupled to a first inter-die wire of the plurality of inter-die wires. The first die also can include a first input having a second flip-flop coupled to a second inter-die wire of the plurality of inter-die wires. The IC structure further can include a second die coupled to the interposer. The second die can be configured with a first circuit design forming circuitry that couples the first inter-die wire to the second inter-die wire.

The first circuit design can form a loop-back path coupling the first inter-die wire with the second inter-die wire within the second die.

In one aspect, the second die can be sequentially configured with a second circuit design. The second circuit design can form circuitry that couples a third inter-die wire with a fourth inter-die wire. The third inter-die wire can be coupled to a second output of the first die. The fourth inter-die wire can be coupled to a second input of the first die.

In another aspect, the first die can be implemented using fixed circuitry. The second die can be implemented as a programmable die. The interposer, for example, can be implemented as a passive die.

The first flip-flop can include an input and an output. The input of the first flip-flop can be coupled to scan chain circuitry within the first die. The output of the first flip-flop can be coupled to a first end of the first inter-die wire.

The second flip-flop can include an input and an output. The input of the second flip-flop can be coupled to a first end of the second inter-die wire. The output of the second flip-flop can be coupled to the scan chain circuitry within the first die. The circuitry implemented within the second die can couple the second end of the first inter-die wire with a second end of the second inter-die wire.

Another embodiment can include an IC structure. The IC structure can include an interposer including a plurality of inter-die wires and a first die coupled to the interposer. The first die can include a first plurality of input and output pairs, wherein each input and each output of the first plurality of input and output pairs includes a flip-flop and is coupled to an inter-die wire of the interposer. The IC structure can include a second die coupled to the interposer. The second die can be configured with a first circuit design that forms circuitry within the second die that, for each pair of the first plurality of input and output pairs, couples the inter-die wire of the output with the inter-die wire of the input.

The first die can include a second plurality of input and output pairs. Each input and each output of the second plurality of input and output pairs can include a flip-flop and can be coupled to an inter-die wire of the interposer. Accordingly, the second die can be sequentially configured with a second circuit design. The second circuit design can form circuitry within the second die that, for each pair of the second plurality of input and output pairs, couples the inter-die wire of the output with the inter-die wire of the input.

In one aspect, for each pair of the first plurality of input and output pairs, the circuitry implemented within the second die can couple the inter-die wires of the pair within the second die forming a loop-back path.

In another aspect, the first die can be implemented using fixed circuitry and the second die can be implemented as a programmable die.

For each output, the flip-flop can include a first test signal input coupled to scan chain circuitry within the first die and a first test signal output coupled to a first inter-die wire of the input and output pair to which the output belongs.

For each input, the flip-flop can include a second test signal input coupled to a second inter-die wire of the input and output pair to which the input belongs and a second test signal output coupled to the scan chain circuitry within the first die.

Another embodiment can include a method of testing an IC structure that includes a first die and a second die coupled through an interposer. The method can include loading a first circuit design within the second die, wherein the second die is a programmable die and the first circuit design forms circuitry that couples a first inter-die wire of the interposer to a second inter-die wire of the interposer. The method can include providing a first test signal, at an operational speed of the IC structure, to the first die and propagating the first test signal through scan chain circuitry to a first output of the first die. The first test signal can be sent from the first output over the first inter-die wire. A determination can be made as to whether the first test signal loops back through the second die and is detected at a first input of the first die that is coupled to the second inter-die wire.

The method further can include loading a second circuit design within the second die, wherein the second circuit design forms circuitry that couples a third inter-die wire of the interposer to a fourth inter-die wire of the interposer, and providing a second test signal to the first die and propagating the second test signal through the scan chain circuitry to a second output of the first die. The method can include sending the first test signal from the second output over the third inter-die wire and determining whether the second test signal loops back through the second die and is detected at a second input of the first die that is coupled to the fourth inter-die wire.

The method can include determining that the first test signal is received at the first input of the first die and determining an actual measure of time for the first test signal to loop-back through the second die.

The method also can include comparing the actual measure of time with an expected measure of time.

An estimate of the resistance of the first and the second inter-die wires can be determined according to the measure of time.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to testing ICs. In accordance with the one or more embodiments disclosed within this specification, circuit structures can be incorporated into a multi-die IC structure that aid in design for testability (DFT). The structures facilitate "at-speed" testing of wires such as interposer, or "inter-die," wires that are used to couple one die of the multi-die IC structure to another die of the multi-die IC structure. By incorporating the DFT structures, testing of the inter-die wires can be automated. Accordingly, automatic test generation equipment can be used to test the inter-die wires and, further, to test delays of signals paths that incorporate the inter-die wires.

Figure 1:
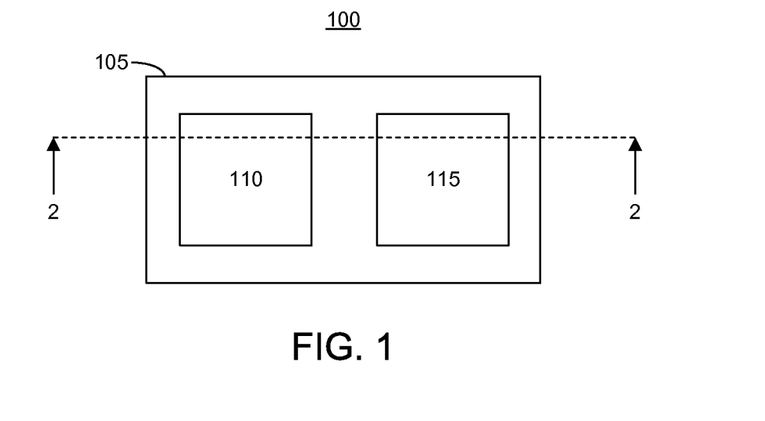
FIG. 1 is a first block diagram illustrating a topographic view of a multi-die integrated circuit (IC) structure in accordance with an embodiment disclosed within this specification.

FIG. 1 is a first block diagram illustrating a topographic view of a multi-die IC structure (IC structure) 100 in accordance with an embodiment disclosed within this specification. In one aspect, IC structure 100 illustrates a packing approach to stacking multiple dies of an IC within a single package. IC structure 100 can include a silicon interposer (interposer) 105, a die 110, and a die 115.

Interposer 105 can be a die having a planar surface on which dies 105 and 110 can be horizontally stacked. As shown, dies 105 and 110 can be located side-by-side on the planar surface of interposer 105. Although implemented with two horizontally stacked dies within FIG. 1, IC structure 100 also can be implemented with more than two dies being horizontally stacked. In another embodiment, die 115 can be stacked vertically on top of die 110. In still another embodiment, interposer 105 can be used as an intermediate layer between two vertically stacked dies. In that case, interposer 105 can isolate vertically stacked dies from one another within a multi-die IC package.

Interposer 105 can provide a common mounting surface and electrical coupling point for two or more dies of a multi-die IC structure. Interposer 105 can serve as an intermediate layer for interconnect routing between dies or as a ground or power plane for IC structure 100. Interposer 105 can be implemented with a silicon wafer substrate, whether doped or un-doped with an N-type and/or a P-type impurity. The manufacturing of interposer 105 can include one or more additional process steps that allow the deposition of one or more layer(s) of metal interconnect. These metal interconnect layers can include aluminum, gold, copper, nickel, various silicides, and/or the like.

Interposer 105 can be manufactured using one or more additional process steps that allow the deposition of one or more dielectric or insulating layer(s) such as, for example, silicon dioxide. In general, interposer 105 can be implemented as a passive die in that interposer 105 can include no active circuit elements. In another aspect, however, interposer 105 can be manufactured using one or more additional process steps that allow the creation of active circuit elements such as, for example, transistor devices and/or diode devices. As noted, interposer 105 is, in general, a die and can be characterized by the presence of one or more TSVs as will be described in greater detail within this specification.

Figure 2:
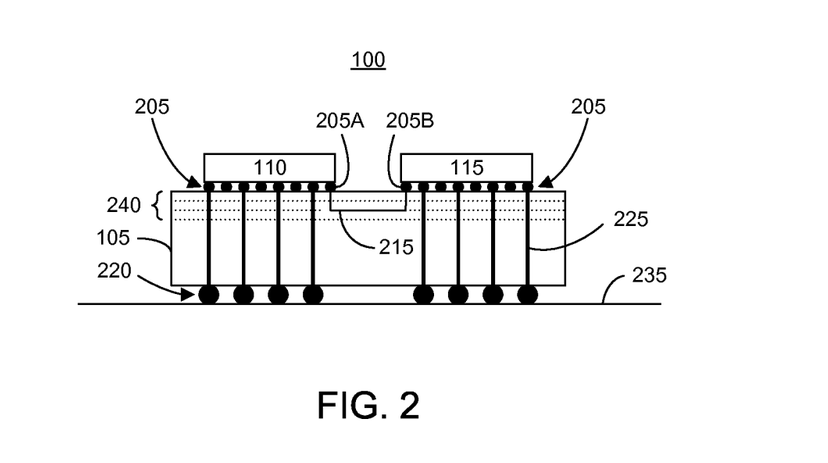
FIG. 2 is a second block diagram illustrating a cross-sectional side view of a multi-die IC structure in accordance with another embodiment disclosed within this specification.

FIG. 2 is a second block diagram illustrating a cross-sectional side view of a multi-die IC structure in accordance with another embodiment disclosed within this specification. More particularly, FIG. 2 illustrates a view of IC structure 100 of FIG. 1 taken along cut-line 2-2. As such, like numbers will be used to refer to the same items throughout this specification.

Referring to FIG. 2, each of dies 110 and 115 can be electrically coupled to interposer 105 via solder bumps 205. In addition, each of solder bumps 205 can serve to physically attach dies 110 and 115 to interposer 105. Through solder bumps 205, for example, interposer 105 is coupled to die 110. Similarly, through solder bumps 205, die 115 is coupled to interposer 105. In an embodiment, solder bumps 205 can be implemented in the form of "micro-bumps."

Although the coupling of dies 110 and 115 to interposer 105 can be accomplished through solder bumps 205, a variety of other techniques can be used to couple interposer 105 to dies 110 and 115. For example, bond wires or edge wires can be used to couple dies 110 and 115 to interposer 105. In another example, an adhesive material can be used to physically attach dies 110 and 115 to interposer 105. As such, the coupling of dies 110 and 115 to interposer 105 via solder bumps 205, as illustrated within FIG. 2, is provided for purposes of illustration and is not intended to limit the one or more embodiments disclosed within this specification.

Interconnect material within interposer 105 can be used to form inter-die wires that can pass inter-die signals between dies 110 and 115. A region labeled 240 of interposer 105 can include one or more conductive, e.g., patterned metal, layers forming wires or interconnects. For example, interconnect 215 can be formed using one or more of the patterned metal layers of region 240. Accordingly, interconnect 215 can represent an inter-die wire that can couple each of solder bumps 205A and 205B, thereby coupling die 110 to die 115 and allowing the exchange of inter-die signals between dies 110 and 115. In addition, interposer 105 can be implemented with multiple conductive layers that can be coupled together with vias (not shown). In that case, interconnect 215 can be implemented within two or more conductive layers coupled together using vias within interposer 105. The use of multiple conductive layers to implement interconnects, e.g., inter-die wires, within interposer 105 allows a greater number of signals to be routed and more complex routing of signals to be achieved within interposer 105.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Solder bumps 220 can be used to electrically couple interposer 105 to a surface 235. Surface 235 can represent, for example, a multi-die IC package in which IC structure 100 is implemented. Solder bumps 220 further can couple IC structure 100 directly to a node external to the multi-die IC package. In an embodiment, solder bumps 220 can be implemented in the form of "C4-bumps." For example, solder bumps 220 can be used to physically attach interposer 105 to surface 235. TSVs 225 represent vias that, when filled with conductive material, form an electrical connection that vertically transverses, e.g., extends through a substantial portion, if not the entirety of, interposer 105.

TSVs 225 can be implemented by drilling or etching an opening into interposer 105 that extends from a first planar surface, i.e., the surface to which solder bumps 205 are coupled, through to a second planar surface, i.e., the surface to which solder bumps 220 are coupled. Conductive material then can be deposited within TSVs 225. Examples of conductive material that can be used to fill TSVs 225 can include, but are not limited to, aluminum, gold, copper, nickel, various silicides, and/or the like. In another example, TSVs 225 can traverse substantially through interposer 105 to couple solder bumps 220 with one or more metal layers of region 240 as are used to form interconnect 215. Interconnect 215 and one or more conventional vias then can couple TSVs 225 to solder bumps 205.

TSVs 225, in combination with solder bumps 220, couple die 110 to surface 235. As shown within FIG. 2, the first planar surface of interposer 105 can be physically coupled to dies 110 and 115. The second planar surface of interposer 105 can be physically coupled to surface 235.

In an embodiment, die 110 of IC structure 100 can be implemented in the form of an application specific integrated circuit (ASIC). In this regard, die 110 can include dedicated circuitry. Dedicated circuitry within die 110 can include one or more portions of circuitry that can be largely fixed. Some of the dedicated circuitry, however, can be parameterized to implement an operational mode that can be selected from a plurality of different operational modes, for example, based upon the register settings. The phrase "dedicated circuitry," however, refers to circuitry that is "hardwired," "fixed," or substantially unchanging. As such, dedicated circuitry is not considered "programmable." Die 115 can be implemented as a die that can be programmed to implement one or more different circuit designs, thereby allowing die 115 to implement different physical circuitry, where each different physical circuitry is defined by the circuit design loaded into die 115. In this regard, the circuitry of die 115 can be considered programmable unlike that of die 110.

Figure 3:
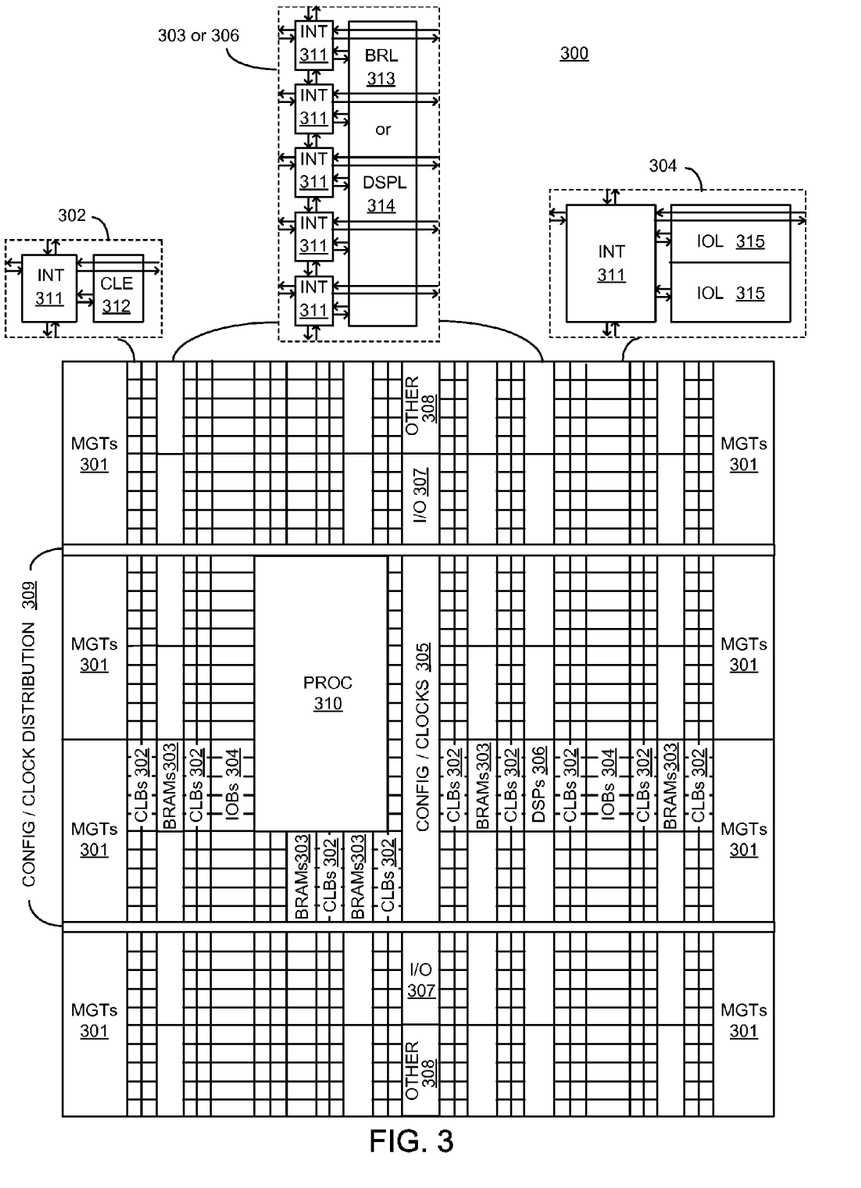
FIG. 3 is a third block diagram illustrating an architecture for an IC in accordance with another embodiment disclosed within this specification.

FIG. 3 is a third block diagram illustrating an architecture 300 for an IC in accordance with another embodiment disclosed within this specification. Architecture 300 can be implemented within a programmable IC or a die such as die 115 of FIGS. 1 and 2. In one example, architecture 300 can be implemented within an FPGA type of IC or die. As shown, architecture 300 includes several different types of programmable circuit, e.g., logic, blocks. For example, architecture 300 can include a large number of different programmable tiles including multi-gigabit transceivers (MGTs) 301, configurable logic blocks (CLBs) 302, random access memory blocks (BRAMs) 303, input/output blocks (IOBs) 304, configuration and clocking logic (CONFIG/CLOCKS) 305, digital signal processing blocks (DSPs) 306, specialized I/O blocks 307 (e.g., configuration ports and clock ports), and other programmable logic 308 such as digital clock managers, system monitoring logic, and so forth.

In some ICs, each programmable tile includes a programmable interconnect element (INT) 311 having standardized connections to and from a corresponding INT 311 in each adjacent tile. Therefore, the INTs 311, taken together, implement the programmable interconnect structure for the illustrated architecture. Each INT 311 also includes the connections to and from the programmable logic element within the same tile, as shown by the examples included at the top of FIG. 3.

For example, a CLB 302 can include a configurable logic element (CLE) 312 that can be programmed to implement user logic plus a single INT 311. A BRAM 303 can include a BRAM logic element (BRL) 313 in addition to one or more INTs 311. Typically, the number of INTs 311 included in a tile depends on the height of the tile. In the pictured embodiment, a BRAM tile has the same height as five CLBs, but other numbers (e.g., four) can also be used. A DSP tile 306 can include a DSP logic element (DSPL) 314 in addition to an appropriate number of INTs 311. An IOB 304 can include, for example, two instances of an I/O logic element (IOL) 315 in addition to one instance of an INT 311. As will be clear to those of skill in the art, the actual I/O pads connected, for example, to IOL 315 typically are not confined to the area of IOL 315.

In the example pictured in FIG. 3, a columnar area near the center of the die (shown shaded in FIG. 3) is used for configuration, clock, and other control logic. Horizontal areas 309 extending from this column are used to distribute the clocks and configuration signals across the breadth of the programmable IC.

Some ICs or dies utilizing the architecture illustrated in FIG. 3 include additional logic blocks that disrupt the regular columnar structure making up a large part of the IC. The additional logic blocks can be programmable blocks and/or dedicated circuitry. A processor block depicted as PROC 310 can be one example of dedicated circuitry that spans several columns of CLBs and BRAMs.

PROC 310 can be implemented as a hardwired processor that is fabricated as part of the die that implements the programmable circuitry of the IC. As a hardwired processor, e.g., a hard-core or dedicated circuitry, PROC 310 exists within the IC without first loading configuration data into the IC. PROC 310 can represent any of a variety of different processor types and/or systems ranging in complexity from an individual processor, e.g., a single core capable of executing program code, to an entire processor system having one or more cores, modules, co-processors, interfaces, or the like.

It should be appreciated that FIG. 3 is provided for purposes of illustration. In this regard, architecture 300 need not include PROC 310 or can include a processor in the form of a soft core. A soft core typically refers to a programmatic description of hardware that performs a particular function. A soft core, for example, can be specified as a hardware description language file or files, as configuration data such as a bitstream that programs a programmable IC, whether fully or partially programmable, as a netlist, or the like. Within a programmable IC, a soft-core type of processor, also referred to as a soft-processor, can be implemented using the programmable circuitry of the IC responsive to the loading of the configuration data described.

A hardwired circuit such as PROC 310 or MGTs 301, for example, can include dedicated circuit blocks, interconnects, and inputs/outputs. A portion of the hardwired circuits, however, still can be set to operate in different modes or states responsive to register settings or other storage elements coupled to the hardwired circuits.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data specifying a circuit design that is loaded into the IC or die.

FIG. 3 is intended to illustrate an exemplary architecture that can be used to implement an IC that includes programmable circuitry, e.g., a programmable fabric, and a processor system. For example, the number of logic blocks in a column, the relative width of the columns, the number and order of columns, the types of logic blocks included in the columns, the relative sizes of the logic blocks, and the interconnect/logic implementations included at the top of FIG. 3 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of PROC 310 within the IC is for purposes of illustration only and is not intended as a limitation of the one or more embodiments disclosed within this specification.

While an FPGA is used as one example of a programmable IC, the phrase "programmable IC" can refer to a variety of other ICs. Another type of programmable IC is the complex programmable logic device, or CPLD. A CPLD includes two or more "function blocks" connected together and to I/O resources by an interconnect switch matrix. In general, the functionality of a programmable IC, in terms of implementing different circuit designs, is controlled by data bits provided to the device for that purpose. The data bits, e.g., a bitstream, specify a circuit design and can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic. A programmable IC or die further can include an ASIC that includes at least some programmable circuitry.

In general, a programmable IC or programmable die refers to a device that can be configured to implement one or more different physical circuits responsive to the loading of configuration data specifying a circuit design that defines the physical circuit. Prior to the loading of configuration data, the programmable circuitry of the die is not operational. This is to be contrasted with conventional processors that simply execute program code, but do not implement different physical circuits or circuit functions and dies that include fixed circuitry that is functional without the loading of configuration data.

Figure 4:
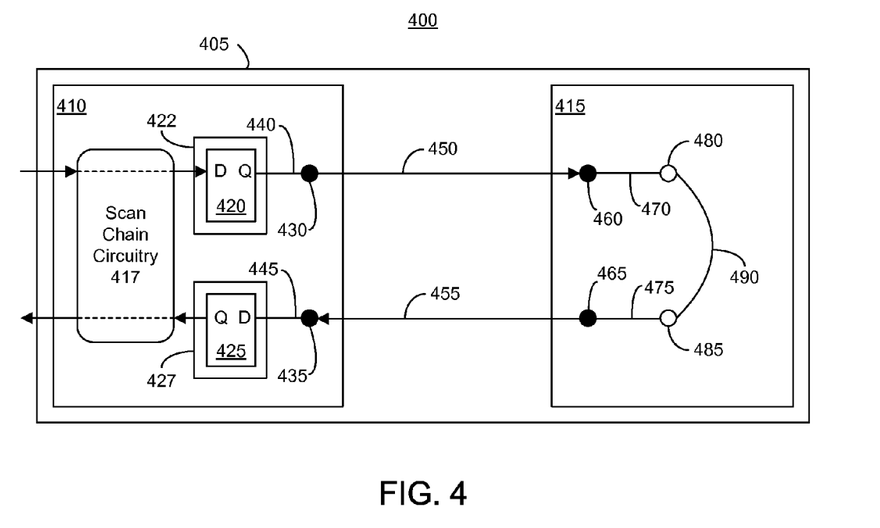
FIG. 4 is a fourth block diagram illustrating design for testability features of a multi-die IC structure in accordance with another embodiment disclosed within this specification.

FIG. 4 is a fourth block diagram illustrating design for testability features of an IC structure in accordance with another embodiment disclosed within this specification. IC structure 400 can be implemented substantially as described with reference to FIGS. 1-2. For example, IC structure 400 can include an interposer 405, a die 410, and a die 415. Die 410 can be implemented using dedicated or fixed circuitry, e.g., as an ASIC. Die 415 can be implemented in the form of a programmable IC or die. For example, die 415 can be implemented using the architecture illustrated in FIG. 3, but is not intended to be limited to any particular programmable IC architecture. Interposer 405 can include inter-die wires that couple pins of die 410 to pins of die 415.

In general, IC structure 400 and, more particularly, interposer 405, can include many more wires than are shown. For example, modern interposers can include thousands of inter-die wires available for coupling pins of dies 410 and 415. Only two inter-die, e.g., interposer, wires are shown for ease of illustration. The particular number of inter-die wires included within interposer 405, however, is not intended as a limitation of the one or more embodiments disclosed herein.

As noted, FIG. 4 illustrates DFT features of IC structure 400. In one aspect, IC 400 can be formed of known good dies in that die 410 and die 415 have undergone some degree of testing, for example, during wafer testing or sort. As such IC structure 400 can represent a packaged multi-die IC. Die 410 can include a flip-flop (flop) 420 and a flop 425. In an embodiment, inputs and outputs of die 410 can be configured to include a flop as shown. For example, each input and each output, at least with respect to those inputs and outputs that are coupled to inter-die wires of interposer 405 for communication with die 415, can be configured to include a flop as shown.

Accordingly, die 410 can include an output 422. Output 422 can include flop 420. Flop 420 can include an input labeled "D" and an output labeled "Q." The input of flop 420 can be coupled to scan chain circuitry 417 within die 410. The output of flop 420 can be coupled to pin 430 of die 410 through wiring 440. Flop 420 can function as a driver of inter-die wire 450. Wiring 440, for example, can represent a wire or a conductive path having low resistance that couples the output of flop 420 to pin 430. It should be appreciated that FIG. 4 is not drawn to scale. In this regard, flop 420 can be located close to pin 430 with little if any appreciable signal propagation delay occurring over wiring 440. For example, wiring 440 can represent a single wire so that flop 420 is not separated from pin 430 by any other intervening circuit elements.

Similarly, die 410 can include an input 427. Input 427 can include flop 425. Flop 425 can include an input labeled "D" and an output labeled "Q." The output of flop 425 can be coupled to scan chain circuitry 417 within die 410. The input of flop 425 can be coupled to pin 435 of die 410 through wiring 445. Wiring 445 can be implemented substantially as described with reference to wiring 440. Flop 425 can be located close to pin 435 with little if any appreciable signal propagation delay occurring over wiring 445. For example, wiring 445 can represent a wire so that flop 425 is not separated from pin 435 by any other intervening circuit elements.

Scan chain circuitry 417 can be coupled to inputs and outputs of IC structure 400. Accordingly, test signals can be provided to IC structure 400 via an input of IC structure 400 and propagated to output 422 of die 410 via scan chain circuitry 417. Looped-back test signals to be read out of IC test structure 400 can be propagated from input 427 of die 410 through scan chain circuitry 417 to an output of IC structure 400.

Each of pins 430 and 435 can represent a solder ball connection between die 410 and interposer 405. Each of pins 460 and 465 can represent a solder ball connection between interposer 405 and die 415. Inter-die wire 450 can couple pin 430 with pin 460. Inter-die wire 455 can couple pin 435 with pin 465. Each of inter-die wires 450 and 455 can be located entirely within interposer 405.

Referring to die 415, wiring 470 can couple pin 460 to a node 480. Similarly, wiring 475 can couple pin 465 to a node 485. In an embodiment, pin 460, wiring 470, and node 480 can represent an input of an MGT as described with reference to FIG. 3. Similarly, pin 465, wiring 475, and node 485 can represent an output of an MGT. In one aspect, a single MGT can be used having an input and an output. Thus, the single MGT can include pins 460 and 465, wiring 470 and 475, and nodes 480 and 485. In such an embodiment, wiring 490 can represent internal wiring of the MGT.

In another aspect, pin 460, wiring 470, and node 480 can be located in a first MGT. Pin 465, wiring 475, and node 485 can be located in a second and different MGT. In that case, wiring 490 can represent configurable or programmable interconnect circuitry that is available within die 410. Being programmable interconnect circuitry, it should be appreciated that wiring 490 only couples node 480 with node 485 subsequent to being programmed to do so. When die 415 is in a non-configured state, wiring 490 does not couple node 480 with node 485.

In another embodiment, pin 460 and wiring 470 can represent an input of die 415, e.g., an I/O block. Pin 465 and wiring 475 can represent an output of die 415, e.g., another I/O block. Node 480 and node 485, for example, can be programmable interconnect points (PIPs) or INTs as described with reference to FIG. 3. Wiring 490 can represent programmable interconnect circuitry or wires that are available by appropriately programming nodes 480 and 485 to establish the connections shown in FIG. 4. It should be appreciated that wiring 490 can include additional PIPs or INTs as may be required. In order to reduce the number of potential faults and simplify testing, a more direct path between inter-die wires 450 and 455 with fewer or the least number of wires and/or PIPs or INTs can be desired.

A test signal can be provided to IC structure 400. The test signal can be propagated through an input of IC structure 400 to scan chain circuitry 417, and to the input of flop 420. The test signal can propagate through wiring 440, pin 430, inter-die wire 450, pin 460, and wiring 470 to node 480. The same test signal can continue to propagate and loop back to die 410 through wiring 490, node 485, wiring 475, node 465, inter-die wire 455, node 435, to wiring 445, and to the input of flop 425. The looped-back test signal can propagate from the output of flop 425, continue through scan chain circuitry 417, and be output from an output of IC structure 400.

The circuit structure pictured in FIG. 4 illustrates one example of how inter-die wires of interposer 405 can be tested in pairs. Flops can be implemented on inputs and outputs of die 410. An input and output pair can be selected, where the output is coupled to a first inter-die wire and the input is coupled to a second inter-die wire. Die 415, which can be programmable, can be configured to loop back a test signal received via the first inter-die wire, e.g., inter-die wire 450, over the second inter-die wire of the pair, e.g., inter-die wire 455, to die 410.

In an embodiment, the number of inputs and outputs of die 410 that are coupled to inter-die wires need not be matched with the number of inputs and outputs of die 415 that are coupled to inter-die wires. For example, consider the case in which die 410 includes 100 inputs and 150 outputs. In that case, IC structure 400 can be loaded with first configuration data, e.g., a first bitstream, that specifies and, when loaded, implements a first circuit design within die 415. The first circuit design implemented within die 415 can implement sufficient interconnect circuitry, e.g., multiple instances of wiring 490 to couple nodes such as nodes 480 and 485 for different inter-die wire pairs, so that the first 100 outputs from die 410 are looped-back to the 100 inputs of die 410.

After the inter-die wires coupled to the first 100 outputs and the inter-die wires coupled to the 100 inputs are tested, die 415 can be loaded with second configuration data, e.g., a second bitstream, that specifies and, when loaded, implements a second circuit design within die 415. The second circuit design can couple the inter-die wires coupled to the remaining 50 outputs to inter-die wires that are coupled to any 50 of the 100 inputs. Thus, 50 additional inter-die wires, e.g., the 50 inter-die wires coupled to the 50 remaining outputs, can be tested. The process can be repeated as needed to test further inter-die wires via configuration and re-configuration of die 415.

At-speed testing can be performed in one aspect with both flops 420 and 425 being clocked with a same clock signal. Accordingly, effects such as clock skew can be reduced. Consider the case in which testing of inter-die wires is performed by providing a test signal to die 410 and reading the test signal from die 415, or vice versa. When two different clocks are used, e.g., a different clock in each die, accuracy in delay measurements can be compromised. When a same clock is distributed to each of dies 410 and 415, clock skew can result in reduced accuracy in measuring signal propagation delay due, at least in part, to the length of inter-die wires carrying the clock signal. By sending the test signal from a flop and receiving the test signal at a flop in the same die and clocked by the same clock signal, increased accuracy in measuring signal propagation delay from lower clock skew can be achieved. This can result in more accurate at-speed path delay testing.

In general, "at-speed testing" can refer to testing a device or structures within a device, e.g., inter-die wires, at operational speeds or clock speeds of the device, e.g., IC structure 400, as opposed to speeds slower than the operational frequencies of the device. At-speed testing can be particularly important with respect to high speed devices where quantities such as signal propagation delay and resistance can vary significantly with increases in frequency. The test signals can be propagated throughout IC structure 400, as described, at-speed as opposed to at much lower speeds typically used to test circuit elements when an IC structure is still in wafer form prior to packaging. Accordingly, quantities that vary with increases in frequency can be tested more readily.

More accurate delay measurement can aid in detecting defects in inter-die wires relating to delay and/or resistive defects, e.g., where delay and/or resistance is out of tolerance. For example, defects such as voids in the TSVs, misalignment of micro bumps, etc., can lead to increased signal propagation delays and/or increased resistivity. These sorts of defects can be identified by measuring signal propagation delay using the circuitry illustrated in FIG. 4 and comparing the results to known good results, e.g., expected results, to determine whether the structures undergoing testing are within tolerance.

The programmability of die 415 allows testing to be performed without incurring much additional overhead in the form of additional DFT structures being included in IC structure 400. In cases where an input or an output of die 410 cannot be registered due to some design consideration, a test mode flop can be inserted for performing at-speed testing. The test mode flop can be bypassed during normal operation of die 410, e.g., when in the field.

The testing illustrated also facilitates the testing of solder balls, e.g., micro-bumps, since testing each of the many micro-bumps of an IC structure using probe card technology is not feasible. For example, each of dies 410 and 415 can include thousands of micro-bumps coupling dies 410 and 415 to interposer 405. Testing each of the micro-bumps is not always practical or even feasible using probe card technology. Untested micro-bumps can create gaps in testing of IC structure 400.

Probe card testing is typically performed during wafer testing or sort. In general, due to the high operating frequencies of many modern ICs such as IC structure 400 or the various parts thereof, performance testing is not performed until the dies are no longer in wafer form and have been packaged. Though wafer testing does test various functional aspects of a die, wafer testing at frequencies higher than approximately 50 megahertz, e.g., into the gigahertz range, is not feasible. High speed, i.e., at-speed, testing during wafer testing, or sort, is infeasible in large part due to the probe card technology that is used and the physical form of the dies in wafer form. For example, the probe tips of the probe card contact probe pads on the bare wafer. The signal path between the probe tips and the measurement equipment is not a controlled impedance signal path. Further, there can be significant distance between the measurement equipment and the source of the signal being measured from the wafer. These factors, among others, e.g., parasitic capacitances and the like, can significantly inhibit testing at full operational speeds of the dies while in wafer form.

Figure 5:
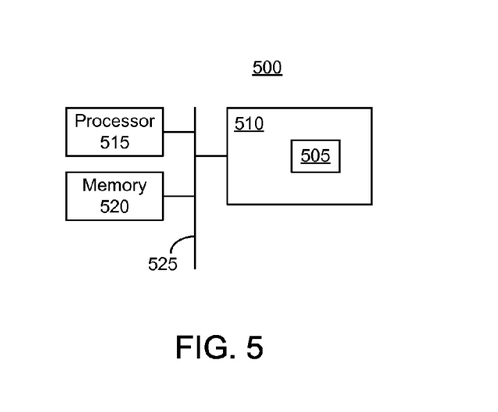
FIG. 5 is a fifth block diagram illustrating a system for testing an IC in accordance with another embodiment disclosed within this specification.

FIG. 5 is a fifth block diagram illustrating a system 500 for testing an IC in accordance with another embodiment disclosed within this specification. System 500, for example, can test an IC structure as described with reference to FIGS. 1-4 of this specification at high speed, e.g., at-speed. In general, system 500 can include a socket 505 or other receptacle mounted on a circuit board 510. Socket 505 can be configured to receive a packaged IC structure that is to be tested, referred to as a device under test (DUT). While system 500 is described in general terms for purposes of illustration, it should be appreciated that system 500 can be implemented as a high capacity or high volume, commercial testing system that can test more than one DUT at a time. In one example, system 500 can be implemented to perform commercial automatic test pattern generation (ATPG).

Circuit board 510 can be communicatively linked with a processor 515 and memory 520 via a system bus 525 or other communication link. As shown, processor 505 can be coupled to memory 520 through system bus 525. As such, system 500 can store program code within memory 520. Processor 515 can execute the program code accessed from memory 520 via system bus 525. System 500 can be implemented in the form of any system including a processor and memory that is capable of performing the functions described within this specification.

Memory 520 can include one or more physical memory devices such as, for example, local memory (not shown) and one or more bulk storage devices (not shown). Local memory can refer to random access memory or other non-persistent memory device(s) generally used during actual execution of the program code. A bulk storage device can be implemented as a hard drive or other persistent data storage device. System 500 also can include one or more cache memories (not shown) that provide temporary storage of at least some program code in order to reduce the number of times program code must be retrieved from a bulk storage device during execution.

Input/output (I/O) devices such as a keyboard and a display optionally can be coupled to system 500, though not shown. The I/O devices can be coupled to system 500 either directly or through intervening I/O controllers. Network adapters also can be coupled to system 500 to enable system 500 to become coupled to other systems, computer systems, remote printers, and/or remote storage devices through intervening private or public networks. Modems, cable modems, and Ethernet cards are examples of different types of network adapters that can be used with system 500.

It should be appreciated that while processor 505, memory 520, and bus 525 are shown as being separate from circuit board 510, in another embodiment, processor 505, memory 520, and bus 525 can be implemented on circuit board 510. In still another embodiment, circuit board 510 can be coupled to a computer system, which can be represented by processor 515, memory 520, and bus 525. Circuit board 510 can be coupled to the computer system via a communication link.

In an embodiment, system 500 can be configured to perform testing as described within this specification. For example, system 500, operating under the control of program code executing therein, can provide test signals, e.g., test vectors, to the DUT and read data out from the DUT. System 500 also can be configured to load one or more different circuit designs into the DUT, reload a same circuit design into the DUT so as to reset the device to a known state, etc. For example, in one aspect, system 500 can provide test signals to the DUT and read the resulting signals from DUT. In this regard, system 500 can determine propagation delay of the signals carried over inter-die wires by determining the time elapsed from when the test signals enter the DUT and when the test signals emerge, or were output, from the DUT. Since the signal paths through the DUT can be known prior to testing, the amount of time for signals to propagate through scan chain circuitry and circuitry of die 415 can be calculated and, for example, either deducted from the measured time or taken into account when determining the propagation delay. The actual measure of time that is determined can be compared with an expected measure of time to determine whether any defects may exist within the DUT and, for example, within the inter-die wires or connections between inter-die wires and the dies.

Figure 6:
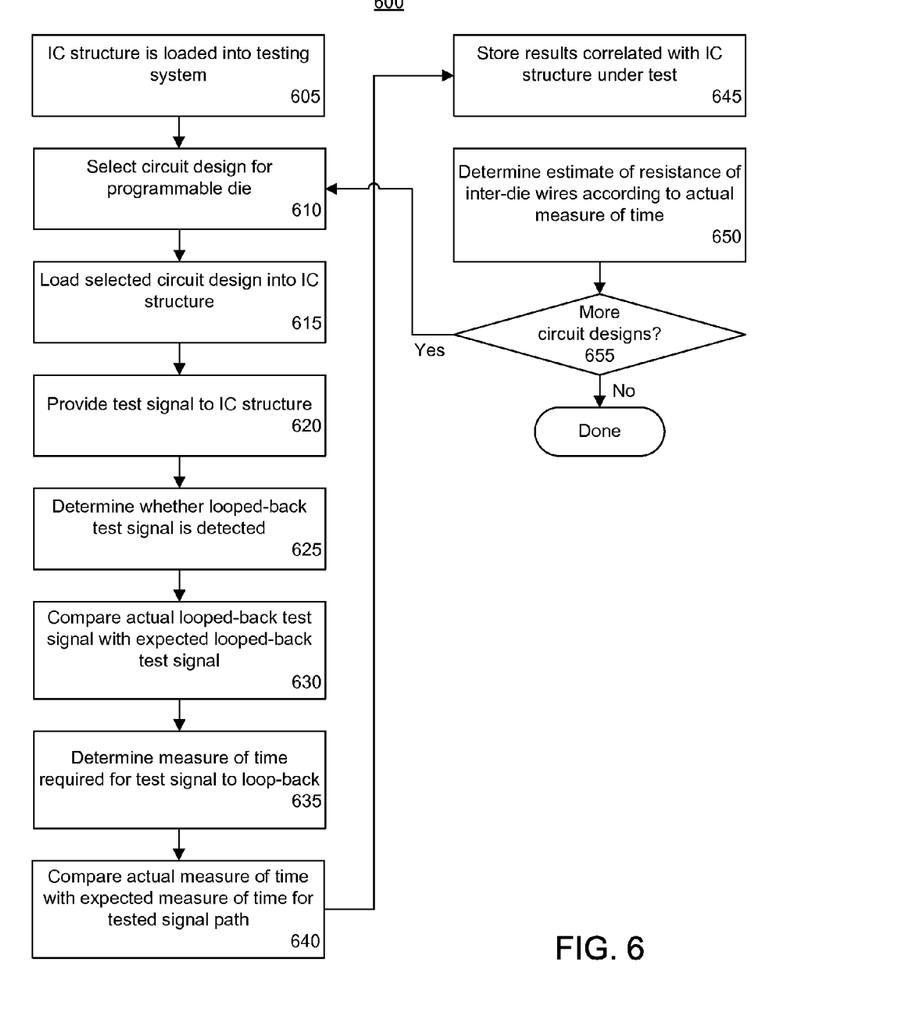
FIG. 6 is a flow chart illustrating a method of testing a multi-die IC structure in accordance with another embodiment disclosed within this specification.

FIG. 6 is a flow chart illustrating a method 600 of testing an IC structure in accordance with another embodiment disclosed within this specification. Method 600 can begin in a state where an IC structure as described with reference to FIGS. 1-4 has been fabricated and placed in a package. Method 600 can be performed upon an IC structure as described using a testing system, for example, as described with reference to FIG. 5. As such, high-speed, or at-speed, testing can be performed.

In step 605, the IC structure can be loaded or placed into the testing system. In step 610, a circuit design can be selected for implementation within the programmable die, e.g., the second die, of the IC structure. In step 615, the selected circuit design can be loaded into the IC structure and, more particularly, into the second die.

Loading the circuit design implements the circuit design within the programmable die forming physical circuitry therein. As discussed, the circuit design can form a connection within the programmable die between two inter-die wires being tested within the interposer. It should be appreciated that while method 600 illustrates testing using a single pair of inter-die wires, the one or more embodiments disclosed within this specification are not intended to be so limited. For example, multiple pairs of inter-die wires can be tested using each circuit design described. Each circuit design, for example, can form circuitry within the programmable die that couples two or more pairs of inter-die wires in a loop back configuration as described within this specification.

In step 620, the testing system can provide a test signal to the IC structure. The testing system, for example, can provide a test signal to an input of the IC structure. The test signal can be propagated through scan chain circuitry to an output of the first die. As discussed, the output of the first die can include an output flop. The output of the first die can be coupled to a first inter-die wire of the inter-die wire pair. For example, a test signal input of the output flop can be coupled to the scan chain circuitry and configured to receive the test signal. A test signal output of the output flop can be coupled to the first inter-die wire of the pair.

An input of the first die can be coupled to the second inter-die wire of the pair. The input of the first die can include an input flop that includes a test signal input coupled to the second inter-die wire and a test signal output coupled to the scan chain circuitry. The test signal input of the input flop can be configured to receive the looped-back version of the test signal. The test signal output of the input flop can be configured to output the looped-back version of the test signal to the scan chain circuitry.

In step 625, a determination can be made as to whether a looped-back test signal has been received. In step 630, any received, e.g., actual, looped-back test signal can be compared with an expected looped-back test signal. The comparison, for example, can indicate whether any faults such as "stuck at 1" or "stuck at 0" faults have been detected.

In step 635, the testing system can determine an actual measure of time between the test signal being sent from the test signal output of the output flop onto the first inter-die wire to when the looped-back test signal is received on the second inter-die wire at the test signal input of the input flop. The actual measure of time indicates the time for the test signal to complete the loop-back signal path described, e.g., to loop back through the second die. In step 640, the testing system can compare the actual time delay with the expected time delay for the particular signal path that was tested. In step 645, the results from the test can be stored.

In step 650, the testing system can determine an estimate of the resistance of the inter-die wires that were tested according to the actual measure of time that was determined. Given that the characteristics of the circuitry formed within the second die and the scan chain characteristics are known, the resistance of the inter-die wires can be estimated using one or more known techniques. When the actual measure of time is larger than expected leading to an estimate of resistance that exceeds the expected level of resistance, the testing system can determine that a defect likely exists within one or both of the tested inter-die wires.

In step 655, the testing system can determine whether further circuit designs, and thus, further inter-die wire pairs remain to be tested. When additional circuit designs remain, method 600 can loop back to step 610 to select a different circuit design. As discussed, each circuit design can be configured to test one or more different inter-die wire pairs and one or more different input(s) and/or output(s) of the first die. Circuit designs can be selected and loaded sequentially as method 600 repeats until each of the inter-die wires for which testing is desired has been tested. When no further circuit designs remain, method 600 can end. It should be appreciated that method 600 can be performed as needed to test further IC structures.

The one or more embodiments disclosed within this specification provide for at-speed testing of circuit structures within a multi-die IC structure. Circuit structures such as inter-die wires and the electrical connections between the inter-die wires and dies coupled to the interposer can be tested at operational speeds of the IC structure as opposed to being constrained to testing speeds of the test equipment.

The flowchart in the figure illustrates the architecture, functionality, and operation of possible implementations of systems, methods and computer program products according to one or more embodiments disclosed within this specification. In this regard, each block in the flowchart can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which includes all the features enabling the implementation of the methods described herein. The device can include a data storage medium, e.g., a non-transitory computer-usable or computer-readable storage medium, storing program code that, when loaded and executed in a system having memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit (IC) structure, comprising:
an interposer comprising a plurality of inter-die wires;
a first die coupled to the interposer, wherein the first die comprises a first output comprising a first flip-flop coupled to a first inter-die wire of the plurality of inter-die wires and a first input comprising a second flip-flop coupled to a second inter-die wire of the plurality of inter-die wires; and
a second die coupled to the interposer, wherein the second die is configured with a first circuit design forming circuitry that couples the first inter-die wire to the second inter-die wire;
wherein the first circuit design forms a loop-back path coupling the first inter-die wire with the second inter-die wire within the second die.

2. The IC structure of claim 1, wherein the loop-back path propagates a same test signal received over the first inter-die wire within the second die back to the first die over the second inter-die wire.

3. The IC structure of claim 1, wherein the second die is sequentially configured with a second circuit design, wherein the second circuit design forms circuitry that couples a third inter-die wire with a fourth inter-die wire, wherein:
the third inter-die wire is coupled to a second output of the first die, and
the fourth inter-die wire is coupled to a second input of the first die.

4. The IC structure of claim 1, wherein the first die is implemented using fixed circuitry.

5. The IC structure of claim 1, wherein the second die is implemented as a programmable die.

6. The IC structure of claim 1, wherein the interposer is a passive die.

7. The IC structure of claim 1, wherein the first flip-flop comprises an input and an output, wherein:
the input of the first flip-flop is coupled to scan chain circuitry within the first die, and
the output of the first flip-flop is coupled to a first end of the first inter-die wire.

8. The IC structure of claim 7, wherein the second flip-flop comprises an input and an output, wherein:
the input of the second flip-flop is coupled to a first end of the second inter-die wire, and
the output of the second flip-flop is coupled to the scan chain circuitry within the first die.

9. The IC structure of claim 8, wherein the circuitry implemented within the second die couples a second end of the first inter-die wire with a second end of the second inter-die wire.

10. An integrated circuit (IC) structure, comprising:
an interposer comprising a plurality of inter-die wires;
a first die coupled to the interposer, wherein the first die comprises a first plurality of input and output pairs, wherein each input and each output of the first plurality of input and output pairs comprises a flip-flop and is coupled to an inter-die wire of the interposer; and
a second die coupled to the interposer, wherein the second die is configured with a first circuit design that forms circuitry within the second die that, for each pair of the first plurality of input and output pairs, couples the inter-die wire of the output with the inter-die wire of the input, wherein:
the first die comprises a second plurality of input and output pairs, wherein each input and each output of the second plurality of input and output pairs comprises a flip-flop and is coupled to an inter-die wire of the interposer; and
the second die is sequentially configured with a second circuit design, wherein the second circuit design forms circuitry within the second die that, for each pair of the second plurality of input and output pairs, couples the inter-die wire of the output with the inter-die wire of the input.

11. An integrated circuit (IC) structure, comprising:
an interposer comprising a plurality of inter-die wires;
a first die coupled to the interposer, wherein the first die comprises a first plurality of input and output pairs, wherein each input and each output of the first plurality of input and output pairs comprises a flip-flop and is coupled to an inter-die wire of the interposer; and a second die coupled to the interposer, wherein the second die is configured with a first circuit design that forms circuitry within the second die that, for each pair of the first plurality of input and output pairs, couples the inter-die wire of the output with the inter-die wire of the input;

wherein for each pair of the first plurality of input and output pairs, the circuitry implemented within the second die couples the inter-die wires of the pair within the second die forming a loop-back path.

12. The IC structure of claim 11, wherein:

the first die is implemented using fixed circuitry; and the second die is implemented as a programmable die.

13. The IC structure of claim 11, wherein for each output, the flip-flop comprises:

a first test signal input coupled to scan chain circuitry within the first die; and a first test signal output coupled to a first inter-die wire of the input and output pair to which the output belongs.

14. The IC structure of claim 13, wherein for each input, the flip-flop comprises:

a second test signal input coupled to a second inter-die wire of the input and output pair to which the input belongs; and a second test signal output coupled to the scan chain circuitry within the first die.

* * * * *